(12) United States Patent
Lee

(10) Patent No.: US 7,667,330 B2
(45) Date of Patent: Feb. 23, 2010

(54) SEMICONDUCTOR DEVICE FOR PREVENTING INFLOW OF HIGH CURRENT FROM AN INPUT/OUTPUT PAD AND A CIRCUIT FOR PREVENTING INFLOW OF HIGH CURRENT THEREOF

(75) Inventor: Si Woo Lee, Gyeonggi-do (KR)

(73) Assignee: Hynix Semiconductor, Inc. (KR)

( * ) Notice: Subject to any disclaimer, the term of this patent is extended or adjusted under 35 U.S.C. 154(b) by 6 days.

(21) Appl. No.: 12/208,200

(22) Filed: Sep. 10, 2008

(65) Prior Publication Data
US 2009/0065945 A1 Mar. 12, 2009

(30) Foreign Application Priority Data
Sep. 10, 2007 (KR) .................. 10-2007-0091761
Aug. 21, 2008 (KR) .................. 10-2008-0081727

(51) Int. Cl.
*H01L 29/40* (2006.01)

(52) U.S. Cl. .............. 257/773; 257/203; 257/211; 257/335; 257/357; 257/750; 257/758; 257/774

(58) Field of Classification Search ................ 257/275
See application file for complete search history.

(56) References Cited

U.S. PATENT DOCUMENTS 6,114,903 A * 9/2000 Bach ..................... 327/565

* cited by examiner

*Primary Examiner*—N Drew Richards
*Assistant Examiner*—Kyoung Lee
(74) *Attorney, Agent, or Firm*—Baker & McKenzie LLP

(57) ABSTRACT

A semiconductor device includes an input/output pad, an input line of an internal circuit, and a plurality of metal lines formed on a lower portion of the input/output pad to have a buffer area overlapping with a plane area of the input/output pad, wherein one of an entirety and a portion of the plurality of metal lines included in the buffer area forms protective resistance interconnecting the input/output pad to the input line.

14 Claims, 2 Drawing Sheets

US 7,667,330 B2

SEMICONDUCTOR DEVICE FOR PREVENTING INFLOW OF HIGH CURRENT FROM AN INPUT/OUTPUT PAD AND A CIRCUIT FOR PREVENTING INFLOW OF HIGH CURRENT THEREOF

CROSS-REFERENCE TO RELATED APPLICATIONS

The present application claims priority under 35 U.S.C. § 119(a) to Korean patent application numbers 10-2007-91761, filed on Sep. 10, 2007, and 10-2008-0081727 filed on Aug. 21, 2008, both in the Korean Intellectual Property Office, which are incorporated herein by reference in their entirety as if set forth in full.

BACKGROUND

1. Technical Field

The embodiments described herein relate to a semiconductor device, and more particularly, to a circuit for preventing inflow of high current from an input/output pad by static electricity, and a semiconductor device using thereof.

2. Related Art

Most semiconductor integrated circuit (IC) devices have a circuit for discharging static electricity between input/output pads and an internal circuit in order to protect the internal circuit from damage by static electricity. Protective resistance may also be implemented between the input/output pads and the internal circuit in order to prevent instant inflow of high current by static electricity.

FIG. 1 is a schematic lay-out diagram of a conventional device having and input/output pad and input terminal. In FIG. 1, an electrostatic discharge circuit 5 includes an input/output pad 10, a protective resistance disposed between the input/output pad 10, and an internal circuit 20, which can include an input buffer. The protective resistance includes a plurality of conductive lines 13 disposed between a wire 12 connected to the input/output pad 10 and a wire 14 connected to the internal circuit 20, wherein the conductive lines 13 are made of polysilicon material. The conductive lines 13 form electrical connections with the wire 12 and the wire 14, and intersected on the respective end portions through contacts 12b and 14b of both ends of the wires 12 and 14, respectively.

The semiconductor device has metal lines formed on the lower layer of the input/output pad 10, in order to buffer physical damage of the input/output pad 10 that may occur during a package bonding process. An interlayer insulating film (not shown) for electrical insulation is generally formed between the metal lines 11 and the input/output pad 10.

The metal lines 11 are for preventing a phenomenon that the input/output pad 10 is stripped due to bonding on the upper portion of the input/output pad 10 during the package bonding process. More specifically, the upper portion of the input/output pad 10 is pressed in a predetermined direction during the bonding step to receive force pulled into the upper portion thereof, as the pressure by the material bonding on the upper portion of the input/output pad 10 is removed. At this time, the input/output pad 10 may be stripped due to the force pulled into the upper portion thereof and the metal lines 11 are used as buffer for preventing the stripping phenomenon described above.

In FIG. 1, the semiconductor device can prevent the occurrence of static electricity by the electrostatic discharge circuit and prevent inflow of high current due to static electricity via the protective resistance including the conductive lines 13. However, the semiconductor device of FIG. 1 requires additional space for forming the protective resistance, wherein the protective resistance has to be applied to all input/output pads. Accordingly, the semiconductor device takes up considerable portions of the entire area of the IC, thereby reducing the size of other semiconductor device disposed on the IC.

SUMMARY

A semiconductor device capable of reducing an area required for forming protective resistance preventing inflow of high current by static electricity is described herein.

In one aspect, a semiconductor device includes an input/output pad, an input line of an internal circuit, and a plurality of metal lines formed on a lower portion of the input/output pad to have a buffer area overlapping with a plane area of the input/output pad, wherein one of an entirety and a portion of the plurality of metal lines included in the buffer area forms protective resistance interconnecting the input/output pad to the input line.

In another aspect, a circuit for preventing inflow of high current that buffers input of high current between an input/output pad and an input circuit includes a physical buffer including a plurality of conductive dummy patterns formed on a lower portion of the input/output pad, one or more conductive dummy patterns being electrically connected to the input/output pad through a first contact, and one or more connection lines intersected with two or more conductive dummy patterns of the plurality of conductive dummy patterns, formed on layers different from the layer on which the intersected conductive dummy patterns are formed and electrically connected to the intersected conductive dummy patterns through a second contact, wherein one of an entirety and a portion of the conductive dummy patterns included in the one or more connection lines and the physical buffer are electrically interconnected between the input/output pad and the input lines to form a protective resistance.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
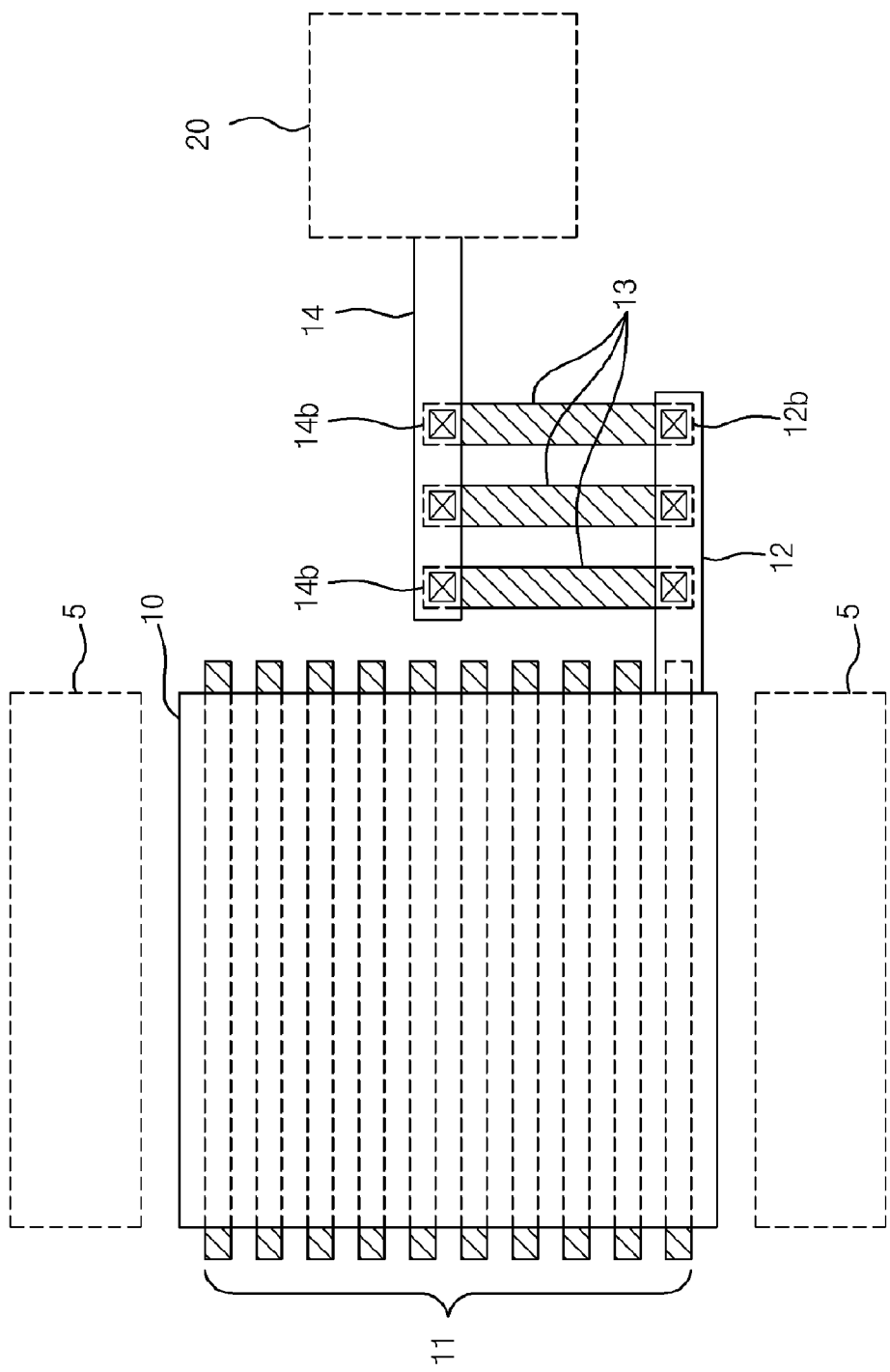
FIG. 1 is a schematic lay-out diagram of a conventional device having an input/output pad and input terminal.
Figure 2:
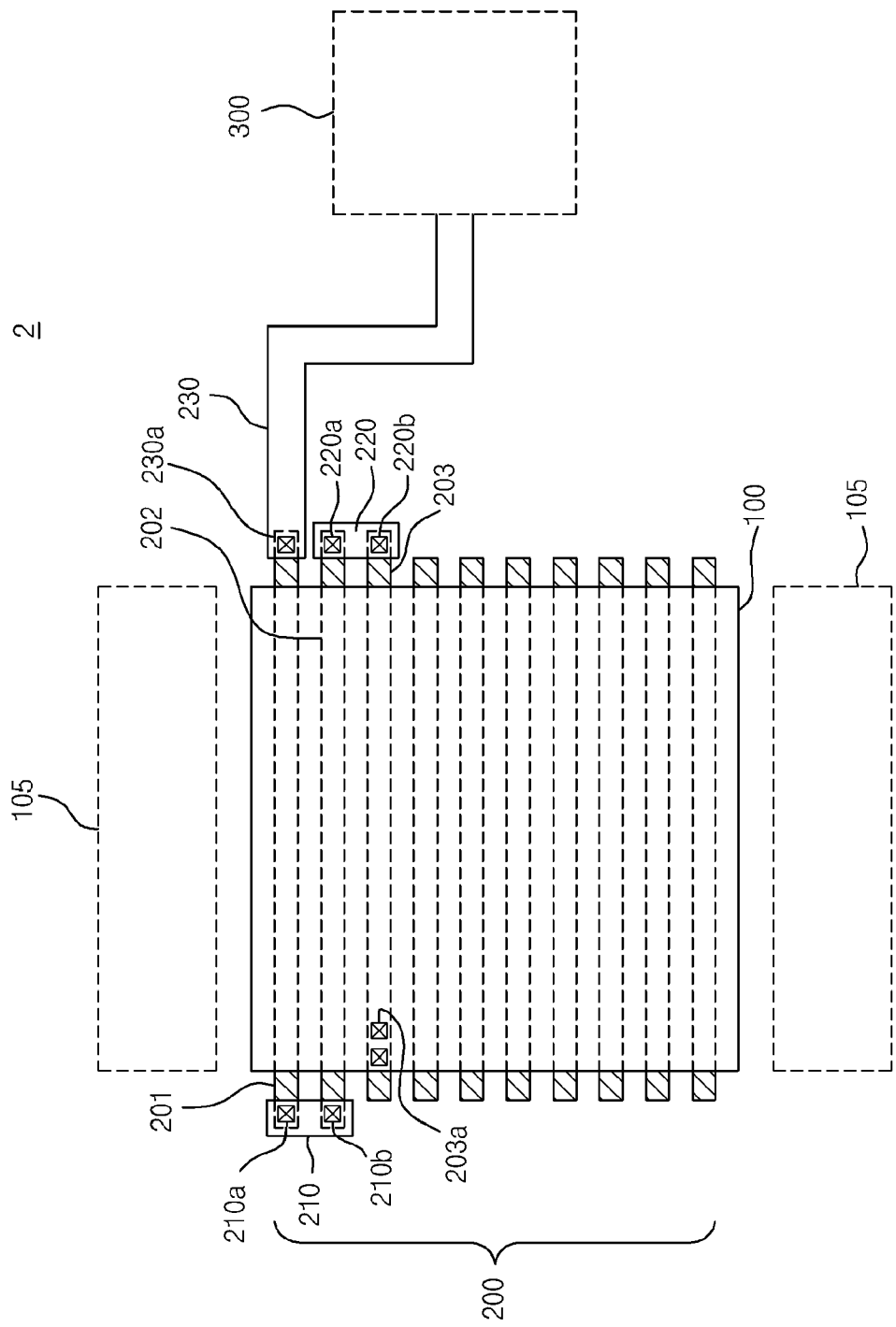
FIG. 2 is a schematic lay-out diagram of an exemplary circuit according to one embodiment.

FIG. 2 is a schematic lay-out diagram of an exemplary circuit according to one embodiment.

Referring to FIG. 2, a semiconductor device 2 can be configured to form a protective resistance preventing inflow of high current from an input/output pad 100 to an internal circuit 300 by static electricity. An electrostatic discharge circuit 105 can be configured to discharge static electricity flowing from the input/output pad 100 and can be arranged in a peripheral area of the input/output pad 100. The electrostatic discharge circuit 105 can include a circuit connected to the input/output pad 100 for discharging the static electricity flowing from the input/output pad 100.

In addition, an interlayer insulating layer (not shown) can be formed on a lower portion of the input/output pad 100, and a plurality of conductive dummy patterns 200 having a bar pattern of metal lines can be formed on a lower portion of the interlayer insulating film. Here, the bar pattern of the metal lines can include an even bar pattern of metal material, wherein the plurality of conductive dummy patterns 200 are physical buffers preventing physical damage that may occur during subsequent bonding processing of the input/output pad 100.

The area on the upper portion of the plurality of conductive dummy patterns 200, overlapping with the input/output pad 100 in a same plane, can become a buffer area for preventing physical damage to the input/output pad 100. Both ends of the plurality of conductive dummy patterns 200 can extend to the outside of the buffer area, wherein the areas can overlap with the input/output pad 100 in a common plane. One or more of the plurality of conductive dummy patterns 203 can be electrically connected to the input/output pad 100 through a contact 203a.

An entirety or a portion of conductive dummy patterns 201, 202, and 203, for example, of the plurality of conductive dummy patterns 200 can be electrically connected to those adjacent to each other through connection lines 210 and 220. Here, the electrical connection between the conductive dummy patterns 201, 202, and 203 and the connection lines 201 and 220 can be made through contacts 210a, 210b, 220a and 220b. The connection lines 210 and 220 can be connected to the ends extended to outside of the area in which the plurality of conductive dummy patterns 200 overlap with the input/output pad 100 in the same plane through the corresponding contact.

The connection lines 210 and 220 and the conductive dummy patterns 201, 202, and 203 can be connected there through to form a protective resistance, wherein the protective resistance can have a serpentine-shape pattern in which the conductive dummy patterns 201, 202, and 203 can be connected to the connection lines 210 and 220 in series.

The conductive dummy pattern 201 of the conductive dummy patterns 201, 202, and 203 included in the protective resistance can be connected to the input line 230 through a contact 230a, and the input line 230 can be electrically connected to an input terminal (not shown) of the input circuit 300. Accordingly, the plurality of conductive dummy patterns 201, 202, and 203 can be formed in two or more layers, wherein the conductive dummy patterns 201, 202, and 203 on each layer can be formed to be identical, symmetrical, or different, and the conductive dummy patterns on different layers can be connected to each other through the connection lines, thereby forming a protective resistance.

The connection lines 210 and 220 can be formed on the same layer as at least one of the input/output pad 100 or the input line 230, and when the connection lines 210 and 220 connect the conductive dummy patterns formed on two or more layers, they can be formed on different layers. Accordingly, the plurality of metal lines 200 formed on the lower portion of the input/output pad 100 can function as physical buffers and the entirety or the portion thereof can be used as the protective resistance against the static electricity. For example, if static electricity is applied to the input/output pad 100 and generates a high current, then the protective resistance can block inflow of instant high current to the input circuit 300.

The protective resistance can control a resistance value due to the material, length, or width of the plurality of conductive dummy patterns 200, or by controlling the number of patterns selected among the plurality of conductive dummy patterns 200. Accordingly, the resistance value of the protective resistance can be easily determined.

As described above, a semiconductor device can form a protective resistance for preventing high current between an input circuit 300 and an input/output pad 100 by static electricity, and the protective resistance can be formed by using an entirety or a portion of physical buffers on a lower portion of the input/output pad 100. Accordingly, there is no need to use a separate area for forming the protective resistance per input/output pad. Thus, miniaturization of the semiconductor device can be accomplished.

According to the embodiments described herein, the protective resistance blocking high current by static electricity can also be formed in a plurality of conductive dummy patterns, wherein resistance values of the protective resistance can be controlled in accordance with material, size, and the selected number of the conductive dummy patterns. Thus, the protective resistance can be scaled.

Also, according to the embodiments described herein, an area required for forming a protective resistance for blocking inflow of high current from an input/output pad by static electricity can be reduced, thereby making it possible to seek miniaturization of a semiconductor device.

The protective resistance for blocking inflow of high current from the input/output pad by static electricity can be formed using conductive dummy patterns used as buffers for protecting the input/output pad from physical damage that can occur during subsequent bonding processes, thereby making it possible to reduce the area required for forming the protective resistance and design the protective resistance in various scales.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A semiconductor device, comprising;
an input/output pad;
an input line of an internal circuit; and
a plurality of metal lines formed on a lower portion of the input/output pad to have a buffer area overlapping with a plane area of the input/output pad,
wherein one of an entirety and a portion of the plurality of metal lines included in the buffer area forms protective resistance interconnecting the input/output pad to the input line.

2. The semiconductor device as set forth in claim 1, wherein the metal lines forming the protective resistance are electrically connected to a connection line formed on a layer outside the buffer area, different from the layer upon which the metal lines are formed, and the connection line contacts a portion extended to the outside of the buffer area of the metal lines.

3. The semiconductor device as set forth in claim 2, wherein the metal lines have a bar pattern, and the extended end of the bar pattern of the metal lines forming the protective resistance contacts the connection line.

4. The semiconductor device as set forth in claim 3, wherein the metal lines forming the protective resistance have a serpentine-shape pattern, together with the connection line.

5. The semiconductor device as set forth in claim 1, wherein the protective resistance is formed by connecting the metal lines to the connection line in series.

6. A circuit preventing inflow of high current that buffers input of high current between an input/output pad and an input circuit, the circuit comprising:
a physical buffer including a plurality of conductive dummy patterns formed on a lower portion of the input/ output pad, one or more conductive dummy patterns being electrically connected to the input/output pad through a first contact; and one or more connection lines intersected with two or more conductive dummy patterns of the plurality of conductive dummy patterns, formed on layers different from the layer on which the intersected conductive dummy patterns are formed and electrically connected to the intersected conductive dummy patterns through a second contact, wherein one of an entirety and a portion of the conductive dummy patterns included in the one or more connection lines and the physical buffer are electrically interconnected between the input/output pad and the input lines to form a protective resistance.

7. The circuit as set forth in claim 6, wherein the plurality of conductive dummy patterns of the physical buffer have a bar pattern.

8. The circuit as set forth in claim 6, wherein the physical buffer is formed of one layer, both ends of the conductive dummy patterns included in the physical buffer are extended to outside of a plane area on which the input/output pad is formed, and the connection lines are formed outside the plane area of the input/output pad.

9. The circuit as set forth in claim 8, wherein the conductive dummy patterns have a metal pattern.

10. The circuit as set forth in claim 8, wherein the connection lines are formed on the same layer as one of the input pad and the input line.

11. The circuit as set forth in claim 6, wherein the physical buffer is formed of the two or more overlapping conductive dummy patterns, both ends of the conductive dummy patterns included in the physical buffer are extended to outside of a plane area on which the input/output pad is formed, and the connection lines are formed outside the plane area of the input/output pad.

12. The circuit as set forth in claim 11, wherein the conductive dummy patterns have a metal pattern.

13. The circuit as set forth in claim 11, wherein the connection lines are formed on the same layer as one of the input pad and the input line.

14. The circuit as set forth in claim 6, wherein the protective resistance is formed by connecting one or more connection lines to one or more conductive dummy patterns in series.

* * * * *